United States Patent
Trezise et al.

(10) Patent No.: US 8,373,584 B2
(45) Date of Patent: Feb. 12, 2013

(54) COMPRESSING AND DECOMPRESSING DATA

(75) Inventors: Gregory Trezise, Wells (GB); Jonathan Peter Buckingham, Bristol (GB); Andrew Hana, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 137 days.

(21) Appl. No.: 13/108,530

(22) Filed: May 16, 2011

(65) Prior Publication Data

US 2012/0293344 A1    Nov. 22, 2012

(51) Int. Cl.
*H03M 7/30* (2006.01)

(52) U.S. Cl. ............................................. 341/87; 341/50

(58) Field of Classification Search ................. 341/87, 341/50, 51, 59, 79, 95, 94, 106, 63, 64, 65; 375/122; 708/203; 709/247
See application file for complete search history.

(56) References Cited

U.S. PATENT DOCUMENTS

| 5,577,248 | A | 11/1996 | Chambers, IV |
| 5,877,711 | A | 3/1999 | Craft |
| 6,657,565 | B2 | 12/2003 | Kampf |
| 6,771,193 | B2 | 8/2004 | Craft |
| 2002/0154040 | A1 * | 10/2002 | Vataja .............................. 341/50 |

FOREIGN PATENT DOCUMENTS

GB    2395641    5/2004

* cited by examiner

*Primary Examiner* — Joseph Lauture

(57) ABSTRACT

A technique includes compressing or decompressing data using a relative displacement of a location of a data pattern.

20 Claims, 5 Drawing Sheets

COMPRESSING AND DECOMPRESSING DATA

BACKGROUND

Lossless data compression may be used for purposes of reducing the size of data stored in mass storage, such as data stored on a magnetic tape, for example. One type of lossless data compression is LZ77 compression, in which strings of characters that appear more than once in the uncompressed data are replaced with references (called "copy pointers") to the repeating strings. As the copy pointer is in general smaller than the size of the string it replaces, the size of the data is reduced. Decompressing LZ77-encoded data involves replacing copy pointers in the decompressed data with copies of the appropriate strings.

DETAILED DESCRIPTION

Figure 1:
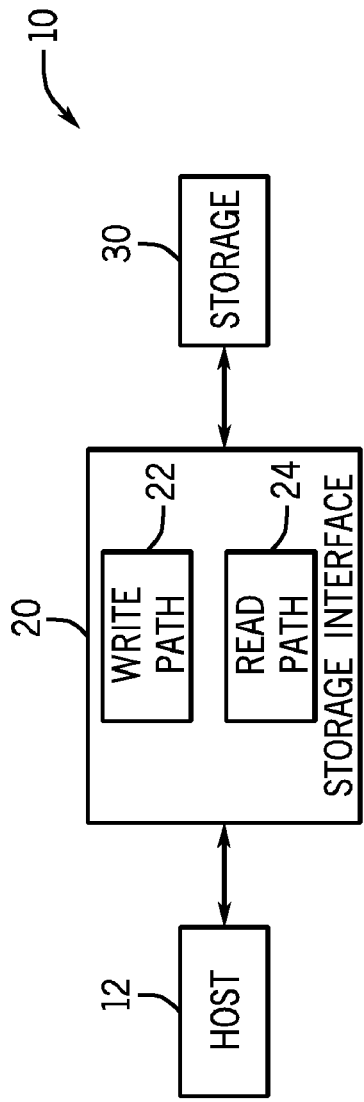
FIG. 1 is a schematic diagram of a system according to an example implementation.

Referring to FIG. 1, in an exemplary system 10, a host 12 may store data in and retrieve data from mass storage 30 (one or multiple tape drives, for example). In general, the host 12 may employ the use of a storage interface 20 (internal or external to the host 12), which compresses data to be stored in the storage 30 and decompresses the compressed data retrieved from the storage 30.

As more a specific example, the host 12 may be a processor-based machine, which is a physical machine that includes one or multiple central processing units (CPUs) and memory storing program instructions that are executed by the CPU(s) to cause the host 12 to generate requests for storing data in and retrieving data from the storage 30. Depending on the particular implementation, the storage interface 20 may be part of the physical hardware of the host 12, may be part of the physical hardware of the storage 30 or may separate from the host 12 and storage 30. In other implementations, the storage interface 20 may be created by the execution of machine executable instructions that are executed by one or multiple CPU(s) on the host 12, the storage 30, or on another entity. Thus, many variations are contemplated and are within the scope of the appended claims.

Regardless of its specific implementation, in general, the storage interface 20 includes a write path 22, which compresses data provided by the host 12 for storage in the storage 30. The storage interface 20 also includes a read path 24 that decompresses the compressed data retrieved from the storage 30 such that the resulting decompressed data may be provided to the host 12.

In accordance with example implementations disclosed herein, the storage interface 20 compresses data to be stored in the storage 30 using lossless compression, such as a compression generally similar to LZ77-based compression, for example. With LZ77 compression, strings of characters that occur more than once in the data are replaced by references, called "copy pointers." In general, each copy pointer is described by a copy pointer codeword 150, which is depicted for an exemplary implementation in FIG. 4.

Figure 4:
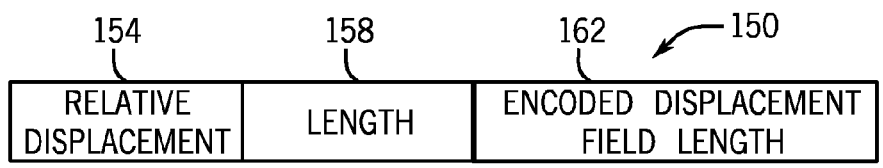
FIG. 4 is an illustration of a copy pointer codeword according to an example implementation.

Referring to FIG. 1 in conjunction with FIG. 4, the codeword 150 indicates (via a relative displacement field 154) the relative displacement of a given string relative to the codeword 150. As shown in the implementation depicted in FIG. 4, the codeword 150 also contains a field 158 that identifies a length of the string and may also contain a field 162 that identifies the length of the relative displacement field 154, which may be used for reasons that are further described below.

It has been discovered that several advantages may flow from having the codeword 150 identify a relative displacement to a given string, as compared to identifying an absolute displacement to the string. More specifically, when encoded, the size of the displacement field is naturally dependent on how far the compressor is allowed to look for matching strings. In this manner, an LZ77 compression-based implementation may use a window, called a "history buffer," for purposes of searching a given unit of data for purposes of locating matching strings. Historically, the history buffer is 1,024 bytes, meaning that the corresponding displacement field is ten bits. Pursuant to more recent standards, the history buffer size may be significantly larger, such as 16,384 bytes, which uses a displacement field size of 14 bits.

The increased history buffer size (one kB to sixteen kB) has two effects assuming for purposes of discussion that the codewords identify absolute, rather than relative displacements: 1.) a string match that occurs at a distance that is farther than one kilobyte (kB) away may be encoded, which is an efficiency improvement; and 2.) a string match that occurs at a distance less than 1 kB back in the data is represented by a codeword that is longer, which is an efficiency reduction. For some data types, the above-described efficiency improvement has a greater effect than the above-described efficiency reduction to therefore improve the compression efficiency.

However, for some other data types, the repeated strings may be relatively close to one another. In other words, there may be more efficiency reductions than efficiency improvements due to the locality of the repeated strings. Thus, depending on the particular mix of data being compressed, it is possible that a larger history buffer may degrade the compression efficiency.

In accordance with exemplary implementations described herein, it has been discovered that for the larger history buffers the compression efficiency may be improved by having the copy pointer codeword 150 indicate a relative displacement (via the relative displacement field 154) to a given string, instead of an absolute displacement. For data having repeated strings that are relatively close together, the relative displacement field 154 may be relatively small, even given that the size of the history buffer may be relatively large. Therefore, compression efficiency is improved, even for a string match that occurs less than 1 kB back in the data.

Figure 2:
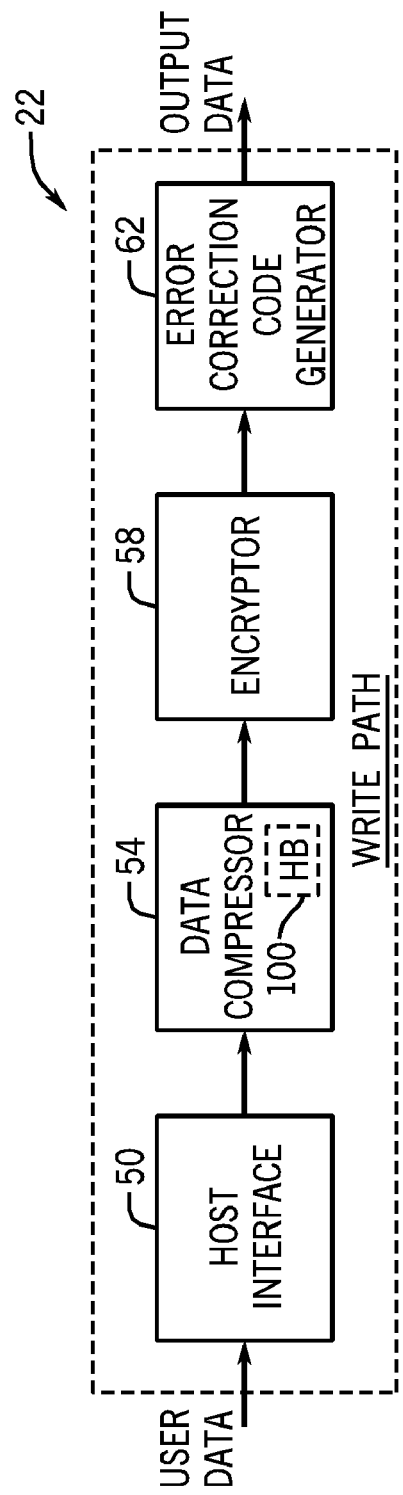
FIG. 2 is a schematic diagram of a write path of a storage interface of the system of FIG. 1 according to an example implementation.

Referring to FIG. 2, as a more specific example, in accordance with some embodiments of the invention, the write path 22 may include a host interface 50, which receives user data.

The received data, in turn, is compressed by a machine-based data compressor 54 of the write path 22, using the relative displacement mentioned herein; and the resulting compressed data is provided to an encryptor 58, which applies an encryption encoding to produce corresponding data to which error correction code is added by an error correction generator 62 to produce the resulting output data that is furnished to the storage 30 (see FIG. 1). In the context of this application, "machine-based" means that the data compressor 54 may be formed from, as a non-limiting example, one or multiple processors (microprocessors, central processing units (CPUs), etc.) executing machine executable instructions stored in a non-transitory storage medium (a semiconductor storage medium, an optical storage medium, a magnetic storage medium, a removable storage medium (such as a DVD, CD-ROM or USB drive), etc.); non-processor-based hardware; a combination of processor and non-processor-based hardware; etc.

Figure 3:
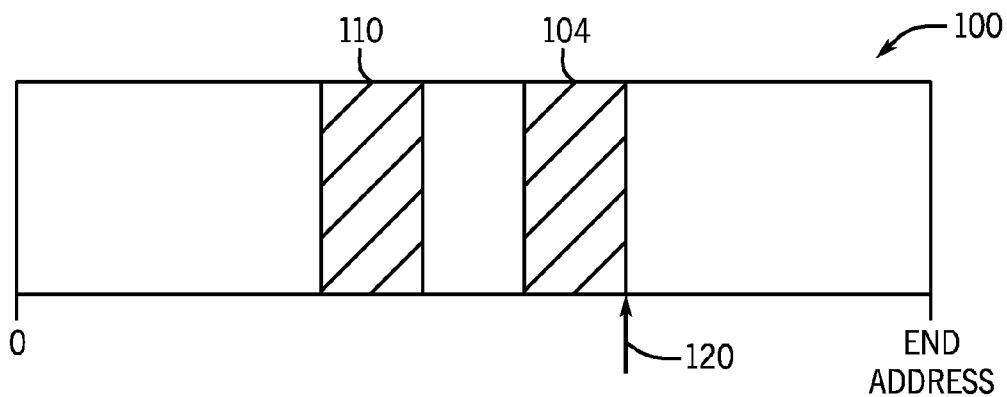
FIG. 3 is a schematic diagram of a history buffer according to an example implementation.

Referring to FIGS. 3 and 4 in conjunction with FIG. 2, regardless of its particular implementation, the data compressor 54 includes a history buffer 100, which is a sliding window established by the data compressor 54 on an input data stream (i.e., the incoming stream of uncompressed data) that is received by the compressor 54. As a more specific example, in accordance with some implementations, the history buffer 100 may be a shift register or a first in first out (FIFO) buffer, which stores data as it is received from the host interface 50.

In accordance with exemplary implementations, the data compressor 54 processes incoming data to be compressed as follows. In general, as new data is received, the data compressor 54 adds the new data is added to the history buffer 100 and removes the oldest data from the history buffer 100 pursuant to the sliding window on the input data stream. As depicted in FIG. 3, the data compressor 54 indexes the location into which the next data byte is received via a current address pointer 120. As also shown in FIG. 3, a current data pattern, or string 104, has been received for this example; and due to this string 104, the data compressor 54 searches for the longest possible match to the newly-received string 104.

For this example, the longest match to the newly-received string 104 is an exemplary string 110, which was received earlier into the history buffer 100. The notation "longest possible match" means that expanding the string search in either direction in the history buffer 100 does not result in a further match. For example, the string 104 may be the sequence "c-a-r." Although the string 110 also contains the substrings "c-a" and "a-r," the longest possible string is "c-a-r." It is noted that the history buffer 100 may contain additional strings, other than the string 110, which match the newly-received string 104. However, the string 110 is the closest to the string 104 in the history buffer 100. In other words, the string 110 is the closest in terms of the memory locations of the history buffer 100 relative to the string 104.

Because the codeword 150 identifies a relative displacement of the string 110 relative to the string 104, the relative displacement field 154 may be significantly smaller than the displacement field used in conventional arrangements, where an absolute displacement is identified.

As a more specific non-limiting example, the history buffer 100 may be 16,383 bytes, i.e., the history buffer 100 spans from address zero to address 16383. For the following non-limiting example, the address of the current pointer 120 is 5170, and the address of the string 110 is 5132. Moreover, the strings 104 and 110 each have a length of 16 bytes. Therefore, if an absolute displacement is encoded as part of the codeword 150, the absolute displacement would identify a displacement of 5,132 bytes, i.e., the absolute position of the string 110 in the history buffer 100. However, due to the use of the relative displacement, the relative displacement field 154 identifies a relative displacement of 22 bytes, i.e., 5,170 bytes less 16 bytes less 5,132 bytes, which means that the displacement field 154 may be significantly smaller in size than the displacement field used in conventional LZ77 coding.

Figure 5:
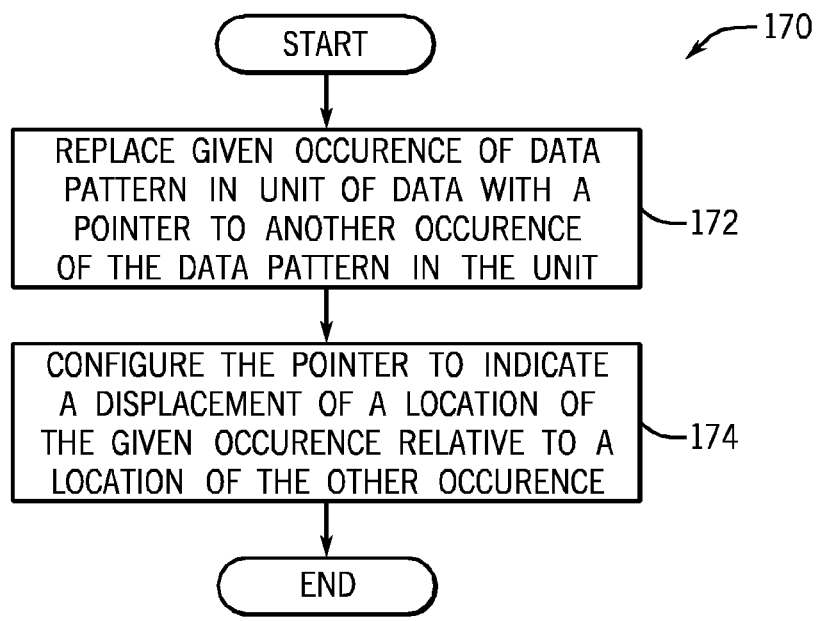
FIGS. 5 and 7 are flow diagrams depicting techniques to compress data according to example implementations.

Referring to FIG. 5, thus, in general, a technique 170 in accordance with embodiments of the invention disclosed herein includes replacing (block 172) a given occurrence of a data pattern in a unit of data with a pointer to another occurrence of the data pattern in the unit. The technique 170 includes configuring (block 174) the pointer to indicate a displacement of a location of the given occurrence relative to a location of the other occurrence.

Figure 6:
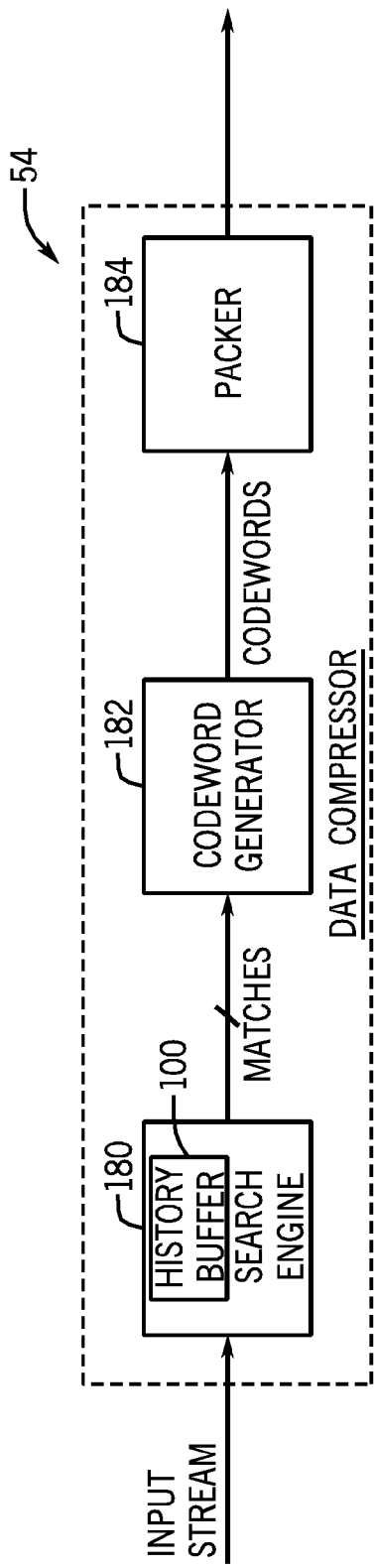
FIG. 6 is a schematic diagram of the data compressor of FIG. 2 according to an example implementation.

Referring to FIG. 6, in accordance with exemplary implementations, the data compressor 54 may include a search engine 180 that, in response to the most recently-received data, performs a search within the history buffer 100 for purposes of identifying matching strings. In this regard, in accordance with some implementations, the search engine 180 may generate signals that identify the longest possible matches to a codeword generator 182 of the data compressor 54. As another variation, in accordance with other implementations, the search engine 180 may generate signals that identify all matches to a codeword generator 182. As yet another example, in accordance with some implementations, the search engine 180 generates signals that identify the longest possible and closest string matches to the codeword generator 182. Thus, many variations are contemplated and are within the scope of the appended claims. Regardless of the particular implementation, the interaction of the search engine 180 and codeword generator 182 informs the codeword generator 182 of the longest possible matches and the relatively closest matches of a given string to another string in the history buffer 100. In response to these matches, the codeword generator 182 generates corresponding codewords, each of which has the general form that is depicted by a codeword 150 in FIG. 4, in accordance with some implementations.

The codewords are received by a packer 184 of the data compressor 54, which assembles the data together into its compressed state. In other words, based on the codewords that are provided by the codeword generator 182, the packer 184 replaces reoccurring data patterns, or strings, with their corresponding codewords to thereby losslessly compress the data.

Referring back to FIG. 4, in accordance with some example implementations, the codeword 150 includes the displacement field length field 162 (which identifies the length of the relative displacement field 154), although the field 162 may be omitted in some implementations. The field 162 is used for implementations in which the sizes of the displacement fields 154 are varied among the codewords 150. This arrangement permits the size of the codeword 150 to be efficiently regulated according to the locations of the corresponding repeated strings that are being replaced by the codewords 150.

As an example, the codewords 150 may contain two differently sized relative displacement fields 154: a short displacement field, for relatively short relative displacements and a long relative displacement field 154 for relatively long displacements. Therefore, the displacement field length field 162 denotes whether the particular codeword 150 is associated with the short or the long displacement field 154. For these implementations in which two displacement field lengths are used, the displacement field length field 162 may be a one bit field (i.e., a field having one of two possible states).

However, other implementations are contemplated and are within the scope of the appended claims. For example, in other example implementations, the codeword 150 may be associated with more than two displacement field lengths. Thus, the displacement field length field 162 may be a multiple bit field, in accordance with some example implementations. Moreover, in accordance with these implementations, the field 162 may be encoded (Huffman encoded, for example).

Figure 7:
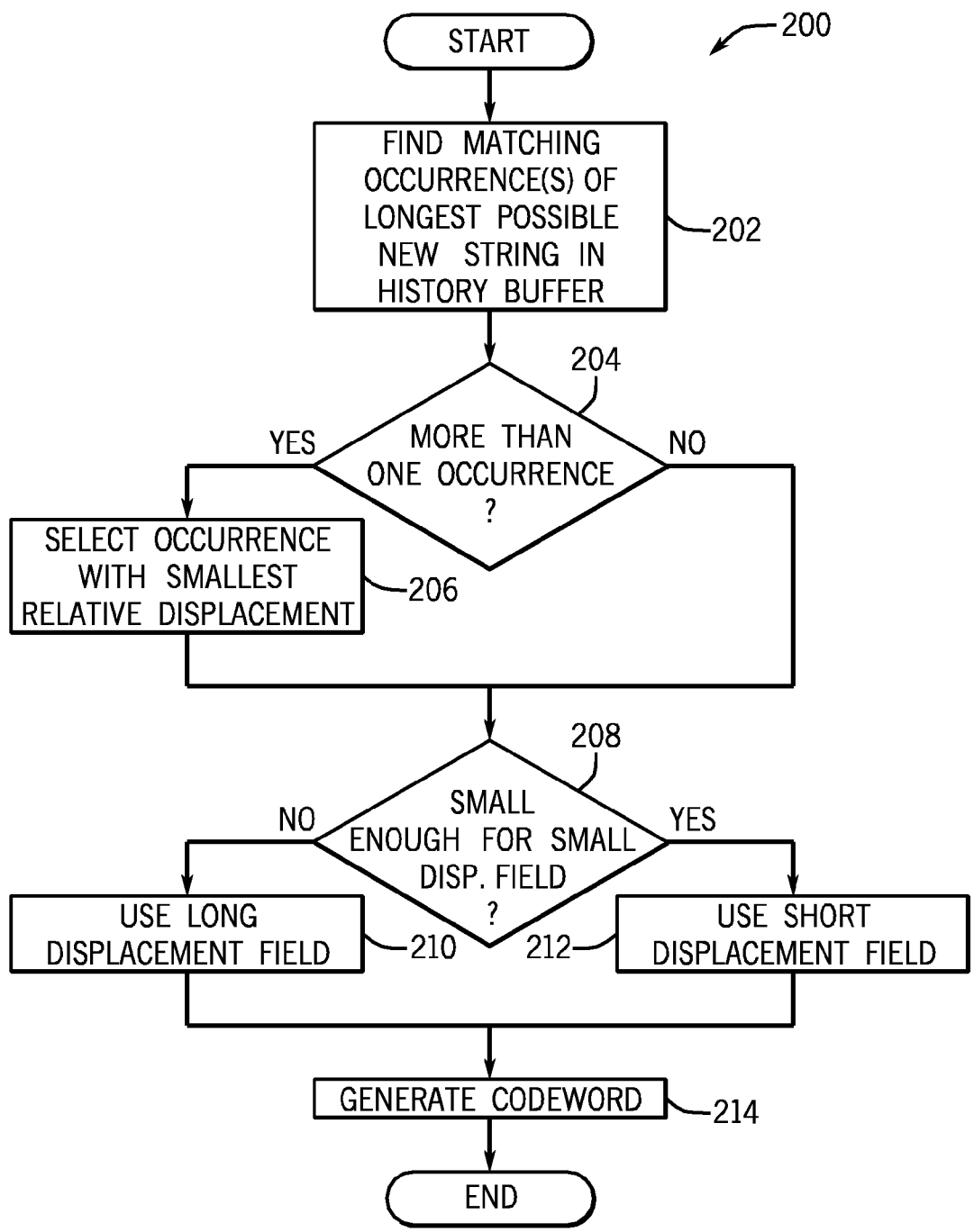

To summarize, the data compressor 54 (FIG. 2) may perform a technique 200, which is depicted in FIG. 7, in accordance with some example implementations. Referring to FIG. 7 in conjunction with FIG. 2, the data compressor 54 finds (block 202) one or more matching occurrences of the longest possible new string in the history buffer 100 and determines (diamond 204) whether there is more than one occurrence. If so, the data compressor 54 selects (block 206) the occurrence with the smallest relative displacement. Next, pursuant to the technique 200, the data compressor 54 determines (diamond 208) whether the relative displacement is small enough for the small displacement field. If so, the data compressor 54 uses (block 212) the short displacement field. Otherwise, for this example, the data compressor 54 uses (block 210) the long displacement field. Next, the data compressor 54 generates the corresponding codeword, pursuant to block 214. The data compressor 54 repeats the technique 200 for additional codewords.

Figure 8:
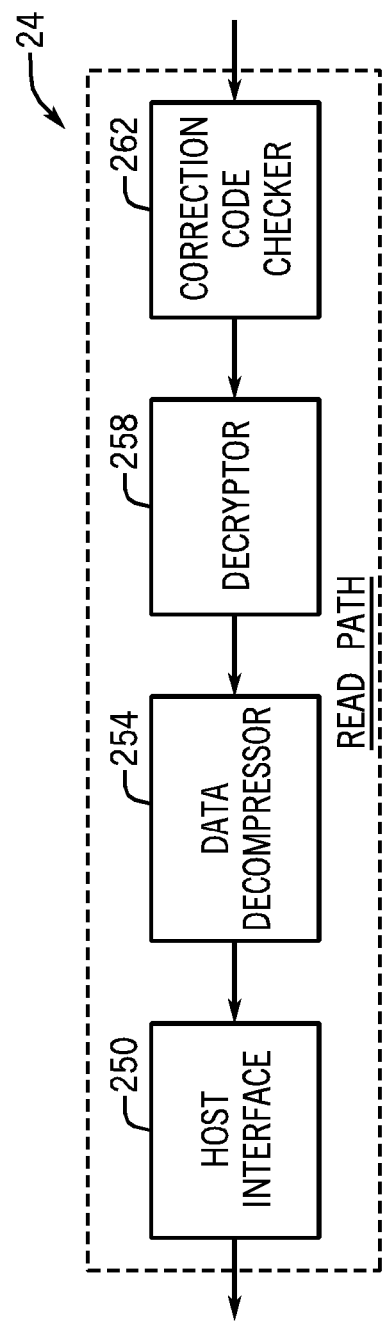
FIG. 8 is a schematic diagram of the read path of FIG. 1 according to an example implementation.
Figure 9:
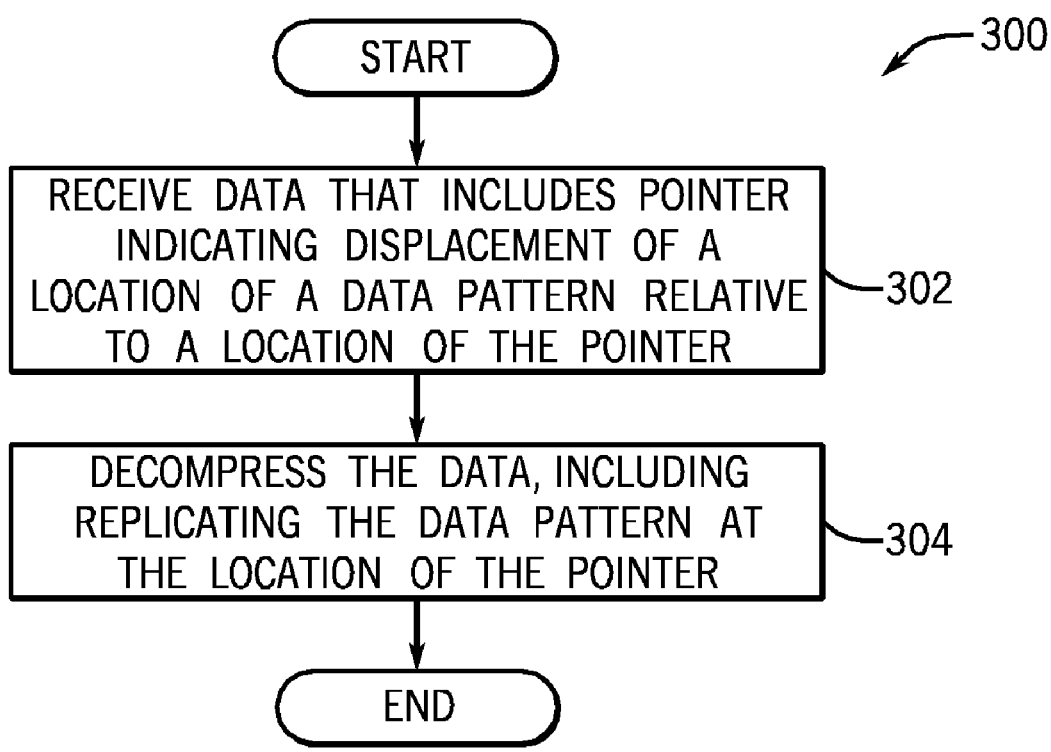
FIG. 9 is a flow diagram depicting a technique to decompress data according to an example implementation.

When the data retrieved from the storage 30 (see FIG. 1), the data is decompressed using the codewords 150. As an example, referring to FIG. 8, the read path 24 may include a machine-based data decompressor 254, which searches for the codewords 150; and for each codeword 150, the data decompressor 254 uses the relative displacement indicated by the codeword 150 to find a corresponding string such that the decompressor 254 replicates the located string in the decompressed data. Among its other features, the read path 24 may generally contain a correction code checker 262 to determine the validity of the data based on the included error correction codes; a decryptor 258 to decrypt and retrieve data that is provided to the data decompressor 254; and a host interface 250 to provide the decompressed data to the host 12 (see FIG. 1). As non-limiting examples, the data decompressor 254 may be formed from one or multiple processors (microprocessors, central processing unit (CPUs), etc.) executing machine executable instructions stored in a non-transitory storage medium (a semiconductor storage medium, an optical storage medium, a magnetic storage medium, a removable storage medium (such as a DVD, CD-ROM or USB drive), etc.); non-processor-based hardware; a combination of processor and non-processor-based hardware; etc Referring to FIG. 9, in general, the data decompressor 254 may perform a technique 300, which includes receiving (block 302) data that includes a pointer indicating a displacement of a location of a data pattern relative to a location of the pointer. Pursuant to the technique 300, the data decompressor 254 decompresses (block 304) the data, including replicating the data pattern at the location of the pointer.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:

processing a unit of data in a machine to compress the unit of data, comprising replacing a given occurrence of a data pattern in the unit of data with a pointer to another occurrence of the data pattern in the unit; and configuring the pointer to indicate a displacement of a location of the given occurrence relative to a location of said another occurrence.

2. The method of claim 1, further comprising:

sorting though the unit of data to ensure that the data pattern is not a subset of a longer data pattern that occurs elsewhere in the unit of data.

3. The method of claim 1, wherein said another occurrence of the data pattern is one of multiple occurrences of the data pattern in the unit of data other than the given occurrence, the method further comprising:

determining whether said another occurrence is closest in location to the given occurrence; and configuring the pointer to indicate the displacement in response to determining that said another occurrence is the closest in location to the given occurrence.

4. The method of claim 1, wherein the displacement is indicated in a displacement field of the pointer, the method further comprising:

configuring the pointer to identify a length of displacement field.

5. The method of claim 4, wherein the pointer comprises one of multiple pointers for the unit of data having displacement fields, and the multiple pointers identify lengths of the displacement fields.

6. A system comprising:

a machine-based search engine to search a unit of data to, in response to a given occurrence of a data pattern in a unit of data, find another occurrence of the data pattern in the unit of data;

a pointer generator to generate a pointer to indicate a displacement of a location of the given occurrence relative to a location of said another occurrence; and a packer to compress the unit of data, the compression including the packer replacing the given occurrence of the data pattern with the pointer.

7. The system of claim 6, wherein the search engine and the pointer generator are adapted to sort though the unit of data to ensure that the data pattern is not a subset of a longer data pattern that occurs elsewhere in the unit of data.

8. The system of claim 6, wherein said another occurrence of the data pattern is one of multiple occurrences of the data pattern in the unit of data other than the given occurrence, and the pointer is configured to determine whether said another occurrence is closest in location to the given occurrence and configure the pointer to indicate the displacement in response to determining that said another occurrence is the closest in location to the given occurrence.

9. The system of claim 6, wherein the pointer comprises a first field to contain data indicative of the displacement and a second field to identify a length of displacement field.

10. The system of claim 9, wherein the pointer comprises one of multiple pointers having displacement fields associated with the unit of data, and the multiple pointers identify lengths of the displacement fields.

11. A system comprising:

a buffer to receive data comprising a pointer indicating a displacement of a location of a data pattern relative to a location of the pointer; and a machine-based decompression engine adapted to replicate the data pattern at the location of the pointer to decompress the data.

12. The system of claim 11, wherein the decompression engine is adapted to perform adaptive lossless data decompression.

13. The system of claim 11, wherein the decompression engine is adapted to search for codewords in the data, each of the codewords comprising a pointer indicating displacement of a location of a data pattern relative to the codeword and a length of the data pattern.

14. The system of claim 13, wherein each of the codewords further indicates a length of the field containing data that indicates the displacement.

15. The system of claim 13, wherein the buffer is adapted to receive the data from mass storage.

16. An article comprising a computer readable storage medium to store instructions that when executed by at least one processor cause said at least one processor to:
replace a given occurrence of a data pattern in a unit of data with a pointer to another occurrence of the data pattern in the unit; and
configure the pointer to indicate a displacement of a location of the given occurrence relative to a location of said another occurrence.

17. The article of claim 16, the storage medium to store instructions that when executed by said at least one processor cause said at least one processor to sort though the unit of data to ensure that the data pattern is not a subset of a longer data pattern that occurs elsewhere in the unit of data.

18. The article of claim 16, wherein said another occurrence of the data pattern is one of multiple occurrences of the data pattern in the unit of data other than the given occurrence, and the storage medium to store instructions that when executed by said at least one processor cause said at least one processor to:
determine whether said another occurrence is closest in location to the given occurrence; and
configure the pointer to indicate the displacement in response to a determination that said another occurrence is the closest in location to the given occurrence.

19. The article of claim 16, wherein the displacement is indicated in a displacement field of the pointer, and the storage medium to store instructions that when executed by said at least one processor cause said at least one processor to configure the pointer to identify a length of displacement field.

20. The article of claim 16, wherein the pointer comprises one of multiple pointers for the unit of data having displacement fields, and the multiple pointers identify lengths of the displacement fields.

* * * * *